US005750943A

United States Patent [19]

Heinz

[11] Patent Number: 5,750,943

[45] Date of Patent: May 12, 1998

[54] SPEAKER ARRAY WITH IMPROVED PHASE CHARACTERISTICS

[75] Inventor: Ralph D. Heinz, Corona, Calif.

[73] Assignee: Renkus-Heinz, Inc., Irvine, Calif.

[21] Appl. No.: 720,623

[22] Filed: Oct. 2, 1996

[51] Int. Cl.[6] ........ H05K 5/00

[52] U.S. Cl. ........ 181/152; 181/192

[58] Field of Search ........ 181/152, 159, 181/187, 192, 195, 144; 381/156, 97

[56] References Cited

U.S. PATENT DOCUMENTS

| | | | |
|---|---|---|---|
| 3,842,203 | 10/1974 | Weisberg . | |
| 3,931,867 | 1/1976 | Janszen . | |
| 4,091,891 | 5/1978 | Hino et al. | 181/192 X |
| 4,344,504 | 8/1982 | Howze | 181/192 X |
| 4,369,857 | 1/1983 | Frazer et al. | 181/159 |
| 4,465,160 | 8/1984 | Kawamura et al. | 181/192 |
| 4,469,921 | 9/1984 | Kinoshita . | |
| 4,496,021 | 1/1985 | Berlant | 181/152 |
| 4,503,553 | 3/1985 | Davis . | |
| 4,633,229 | 12/1986 | Iacono et al. . | |
| 4,811,403 | 3/1989 | Henricksen et al. . | |
| 4,845,759 | 7/1989 | Danley | 381/156 X |
| 4,862,508 | 8/1989 | Lemon . | |
| 5,285,025 | 2/1994 | Yoshioka | 181/192 |

OTHER PUBLICATIONS

ProSound News, Aug. 14, 1996 (The Rules of Mathematics Are No Excuse For Old Fashioned Thinking).

*Primary Examiner*—Khanh Dang
*Attorney, Agent, or Firm*—Knobbe, Martens, Olson, & Bear, LLP

[57] ABSTRACT

An improved method and an apparatus uniformly transmit sounds over large angles of coverage. An acoustic source is attached to a loudspeaker horn with two straight outer side walls and two straight upper and lower outer walls, the projected extensions of which converge at an intersection point behind the acoustic source. The loudspeaker horn also has two inner side walls, and upper and lower inner walls which curve inwardly to the point of attachment with the acoustic source. The sound waves emanating from the loudspeaker horn have an apparent point of origin at the intersection point behind the acoustic source. A plurality of such loudspeaker horns and acoustic sources are positioned in a radial array so that all of the apparent points of origin of the loudspeakers are substantially coincident, creating a coherent signal without interference from overlapping sound waves produced by adjacent loudspeakers.

6 Claims, 11 Drawing Sheets

SPEAKER ARRAY WITH IMPROVED PHASE CHARACTERISTICS

BACKGROUND OF THE INVENTION

1. Field of the Invention

This invention relates generally to loud speaker systems, and specifically to loud speaker systems used to distribute sound waves uniformly over a wide angle of coverage area.

2. Description of the Related Art

Current horn-type loudspeakers are designed to attempt to solve a number of problems associated with the reproduction and transmission of sound. In general, a horn includes three main sections: a throat or first section of the horn which accepts the output of an acoustic source, a wave guide which defines the coverage angles, and a horn mouth or bell which provides for the acoustical transition from horn to free space.

Most conventional horns use a wave guide which is conical in cross-sectional shape because of the convenience of dividing up areas of coverage in the acoustic spaces they are to be used in. However, as these conical sections are not of infinite length, they only provide a limited amount of directivity control. Only those frequencies of sounds where the wavelength is less than or equal to the largest dimension of the wave guide are directed within the coverage angles defined by the wave guide. Because of the length of the wavelengths for sounds in the low frequency region, this generally means that only sounds having higher frequencies are accurately directed by these wave guides.

These conical wave guide sections are also not very efficient at transmitting the lower frequency sounds which the acoustic source may be able to reproduce. It is desirable, however, for the horn to transmit the full bandwidth the acoustic source generates in order to minimize the need for additional acoustic sources. Therefore, these conical wave guides are preceded by throat sections and followed by horn bells which improve their low frequency transmission efficiency.

The typical throat may have exponential or hyperbolic flare rates to optimize low frequency transmission efficiency. Also, in an additional attempt to both lower the directivity cut off and improve the low frequency efficiency, the horn bell at the end of the wave guide flares at a greater rate than the conical wave guide preceding it to make the horn appear to be larger with minimal additional length.

By optimizing the horns in this fashion, a single horn has been created which fairly efficiently transmits a wide frequency of sounds. These horns are, however, not well suited for use in arrays.

By way of example, loud speakers are used in many situations, such as concerts or sporting events, which require increased sound pressure levels that are not attainable using a single speaker. As a result, large-scale loud speaker systems have been proposed utilizing multiple horn-type loudspeakers.

There are numerous disadvantages in using multiple loudspeaker horns of the type described above. One of the most vexing problems has been sound interference. Several of the acoustic horns described may be connected to the same audio signal and directed towards an audience. Because the horn bell of these speakers is quite large in order to provide better low frequency transmission efficiency, the wave guides of the horns are necessarily some distance apart from one another. As a result, a listener perceives the sound waves from each acoustic source as traveling from a different distance and direction.

These sound waves may reinforce one another or reduce one another. In the extreme case, sound waves from one source at a specific frequency may totally cancel sound waves from another source at the same frequency. Similarly, sound waves at the same frequency from different sources may also substantially reinforce one another and result in a large gain increase. Total cancellation or reinforcement rarely occurs, but partial cancellations and reinforcements occur throughout the audience area at different frequencies to a greater or lesser degree, resulting in pronounced changes in frequency response as a function of listening position within the intended coverage area. Unfortunately, the human hearing system is very sensitive to such changes in frequency response.

Regardless of horn orientation, for frequencies below the directivity of the horn, there are many areas in the listening audience in which the coverage areas substantially overlap. These overlaps create significant interference. In addition, these low frequencies prevail audibly at all points outside the parameters of the higher frequency horn coverage. Although the prior art teaches that low-frequency overlap effects and bias can be controlled to some degree, there are no means in the prior art for reducing them to an acceptable level.

Furthermore, it is well known that horns of the type described above exhibit "astigmatism." Such horns have two apparent points of origin; one dictated by the propagation of sound waves in the horizontal plane and one dictated by the propagation of sound waves in the vertical plane. Typically, the apparent point of origin in the wider coverage plane is further forward, toward the mouth of the loud speaker horn, and the apparent point of origin for the narrower coverage plane is further back, near the acoustic source. Most array speakers are designed with the popular 60-degree horizontal×40-degree vertical horns, placing the overall apparent point of origin quite forward of the acoustical source.

SUMMARY OF THE INVENTION

The location of the apparent points of origin of the sound in arrays is the key to improving array performance. The present invention achieves a significant improvement over the prior art by shaping the respective loudspeaker horns in a manner which makes the respective vertical and horizontal apparent points of origin coincident and which position both apparent points of origin behind the physical acoustic source.

An acoustic source is attached to a loudspeaker horn with a surface distal to the acoustic source having two straight outer side walls and two straight upper and lower outer walls, the projected extensions of which converge at an intersection point behind the acoustic source. The loudspeaker horn also has a surface proximal to the acoustic source with two inner side walls, and upper and lower inner walls, which all curve inwardly to the point of attachment with the acoustic source. The distal surface of the horn is coupled to the proximal surface.

The sound waves emanating from the loudspeaker horn have an apparent point of origin at the intersection point behind the acoustic source and positioned on an axis passing through the horn. By positioning a plurality of such loudspeaker horns and acoustic sources positioned in either horizontal, vertical or combined horizontal and vertical radial arrays, the apparent points of origin of all of the loudspeakers are substantially coincident, creating a coherent signal without interference from overlapping sound waves produced by adjacent loudspeakers.

Further objects, features, and advantages of the present invention over the prior art will become apparent from the detailed description of the drawings which follows, when considered with the attached figures.

DETAILED DESCRIPTION OF THE PREFERRED EMBODIMENT

Figure 1:
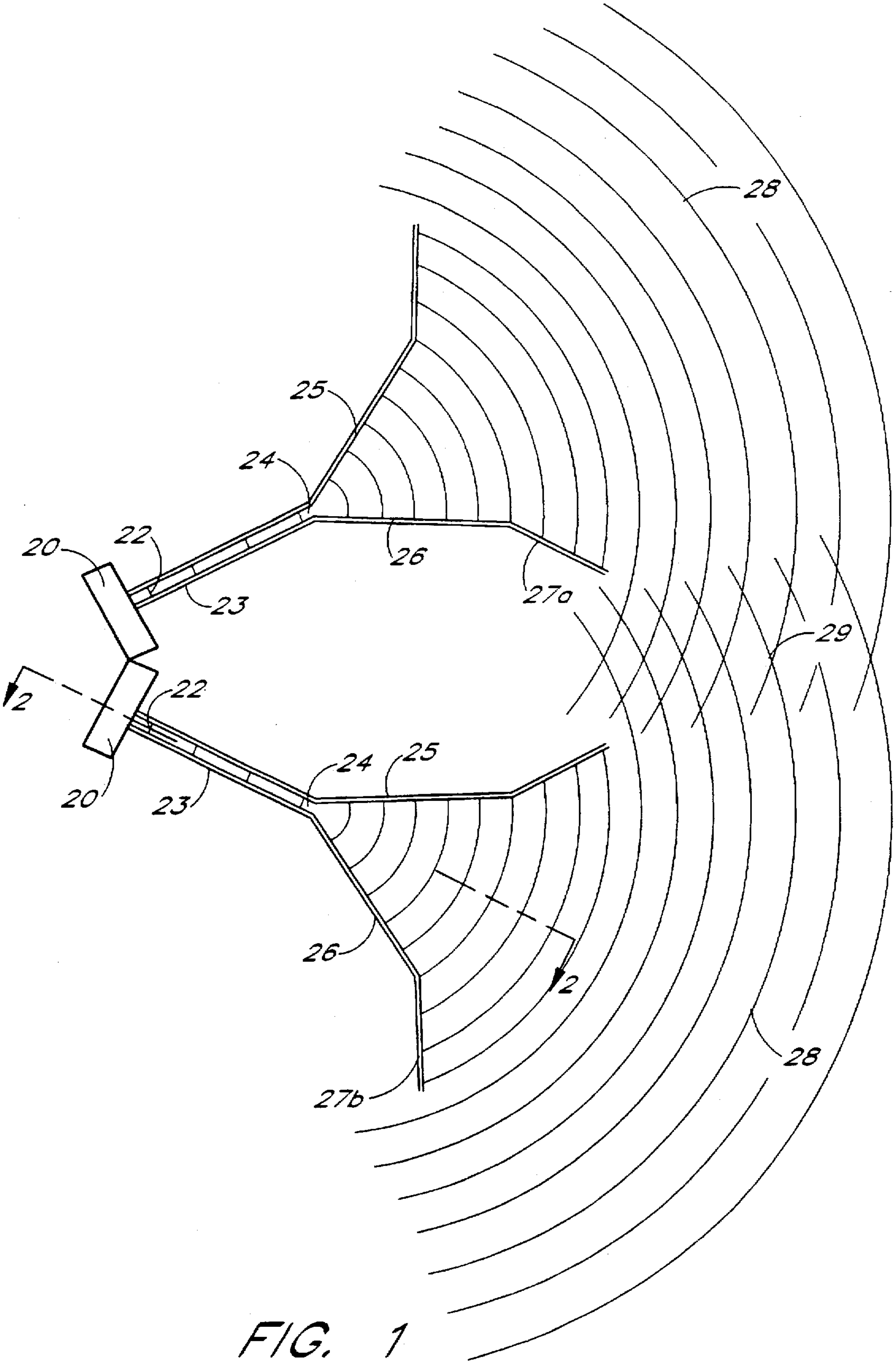
FIG. 1 (PRIOR ART)
FIG. 1 shows a horizontal cross-sectional view of a typical convex circular loudspeaker array according to the prior art.
Figure 2:
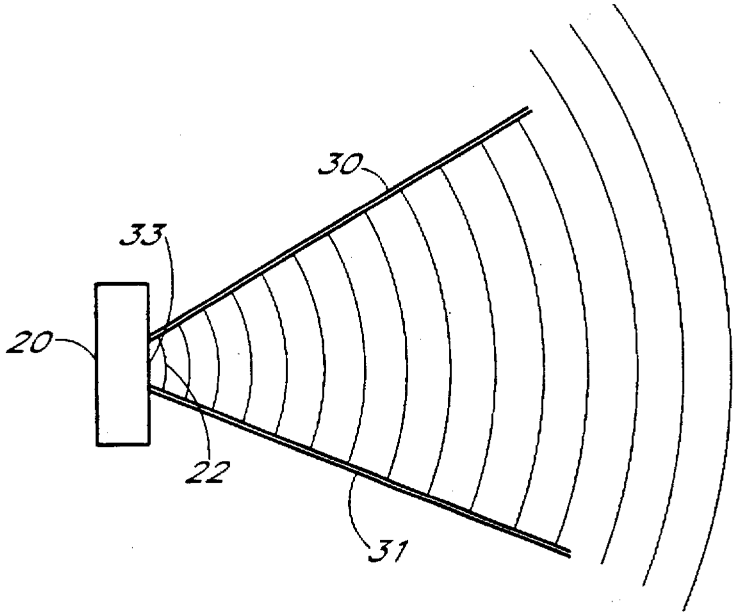
FIG. 2 (PRIOR ART)
FIG. 2 shows a vertical cross-sectional view of a typical loudspeaker used in a convex circular loudspeaker array according to the prior art.
Figure 3:
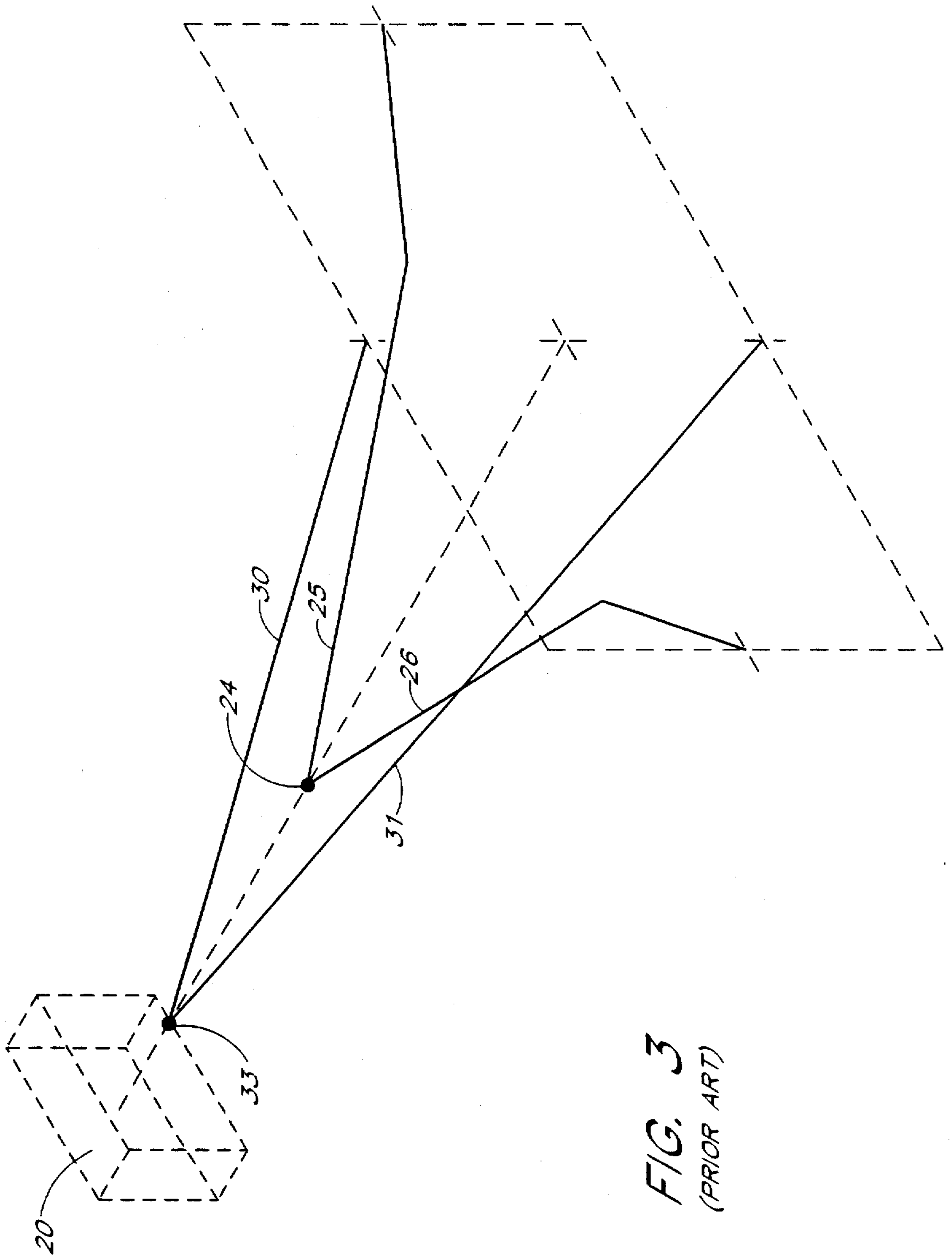
FIG. 3 (PRIOR ART)
FIG. 3 shows a three-dimensional wire-frame view of a typical loudspeaker according to the prior art.

As seen in FIG. 1, according to the prior art, a first loudspeaker horn **27*a* and a second loudspeaker horn 27*b* are attached to respective acoustic sources 20, which are in turn connected to a coherent audio signal. Each acoustic source 20 emits sound waves 22 which travel through the respective loudspeaker throats 23 and into the respective loudspeaker horns 27*a*, 27*b*. The prior art loudspeaker horns 27*a*, 27*b* have astigmatism, producing different apparent points of sound origin in the horizontal and vertical planes. The apparent horizontal points of origin 24 are positioned at the point where the projected extensions of the respective first and second outer side walls 25, 26 of each loudspeaker horn 27*a*, 27*b* converge near the juncture between the respective loudspeaker throat 23 and the respective loudspeaker horn 27*a*, 27*b*. As seen in FIG. 2, the apparent vertical point of origin 33 of each loudspeaker horn 27*a* is positioned near the acoustic source 20, at the point where the projected extensions of the respective upper wall 30 and lower wall 31 converge. As seen in FIG. 3, the apparent vertical point of origin 33 and the apparent horizontal point of origin 24** are in different positions, resulting in varying perceptions of sound origin throughout the listening area.

Moreover, since the apparent horizontal point of origin 24 occurs within the loudspeaker horn **27*a*, 27*b*, a plurality of loudspeaker horns 27*a*, 27*b* in an array cannot be positioned to have coincident horizontal points of origin. As shown in FIG. 1, the loudspeaker horns 27*a*, 27*b* and acoustic sources 20 of the prior art are generally radially positioned with respect to each other in order to direct the outer sound waves 28 into spatially separated conical regions. However, at the converging boundary 29 of the wave fronts produced by the loudspeaker horns 27*a*, 27*b***, the outer sound waves interfere. Such a configuration produces a forward gain, sometimes on the order of 10 dB. Consequently, this is not the best arrangement for uniform coverage.

Figure 4:
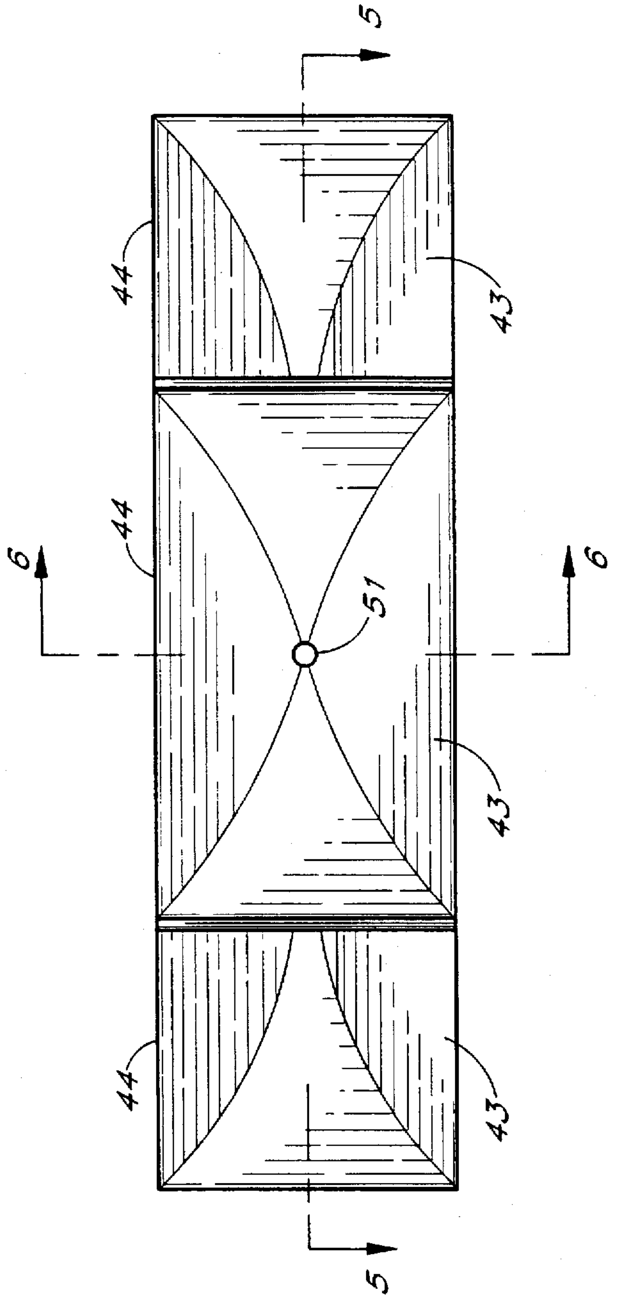
FIG. 4 shows a frontal view of a loudspeaker array according to the present invention.

The present invention minimizes or eliminates the sound interference created by an array of loudspeaker horns operating under the same coherent audio signal. For purposes of simplicity, FIG. 4 shows a frontal view of three loudspeaker horns **43*a*, 43*b*, 43*c***. The present invention functions effectively, however, in an array comprised of only two loudspeaker horns, as well as in arrays comprised of more than three loudspeaker horns. Accordingly, the present invention should not be construed to be limited to an array of three loudspeaker horns.

As used herein, the distal end 44 of each loudspeaker horn **43*a*, 43*b*, 43*c* refers to the mouth of the loudspeaker horn 43. The distal end 44 of the loudspeaker horns 43*a*, 43*b*, 43*c*** is substantially rectangular with comparatively longer horizontal sides and comparatively shorter vertical sides.

Figure 5:
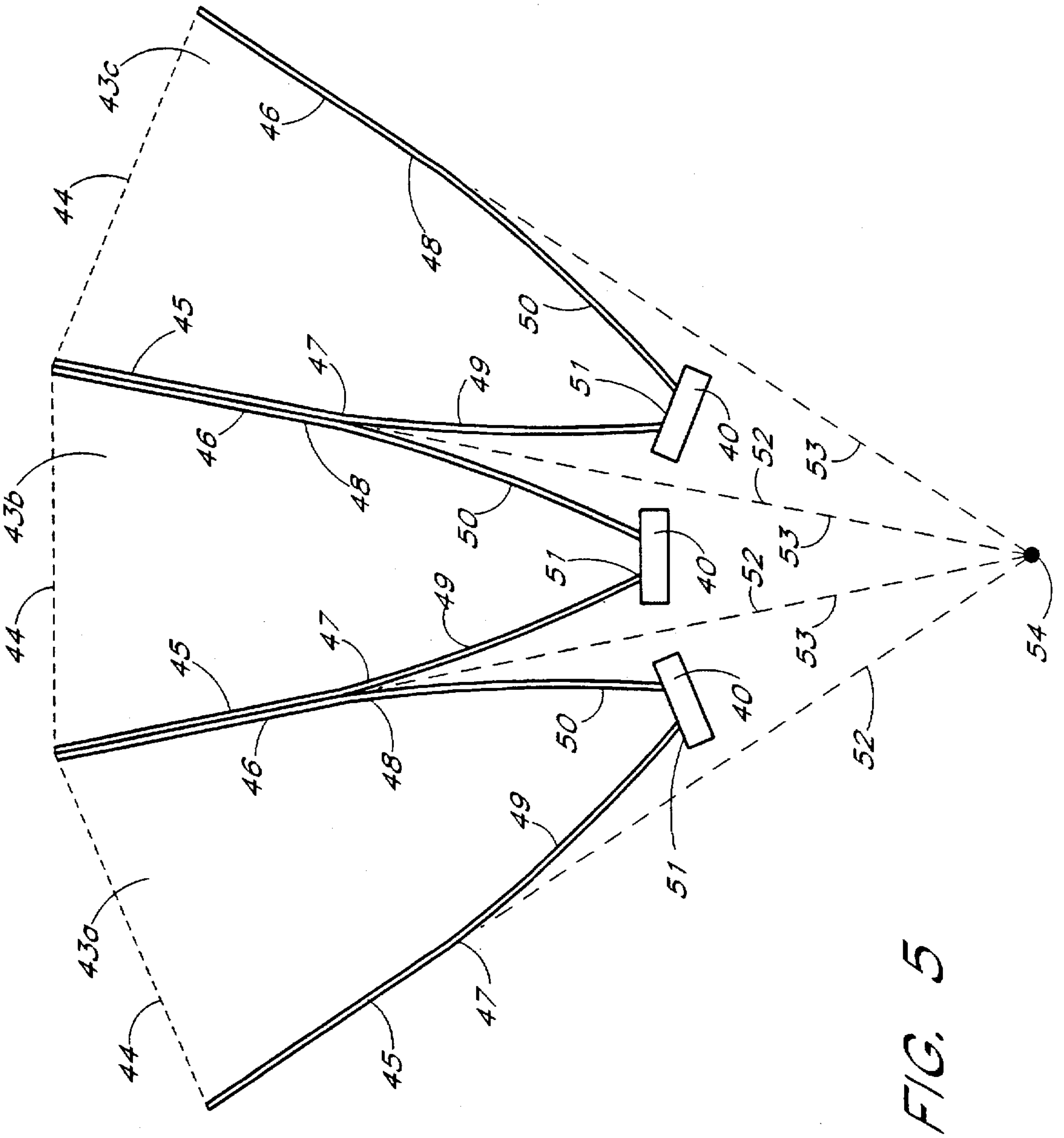
FIG. 5 shows a horizontal cross-sectional view of the loudspeaker array shown in FIG. 4.

As illustrated by FIG. 5 in the horizontal plane, each loudspeaker horn **43*a*, 43*b*, 43*c* is connected to an acoustic source 40, and each of the loudspeaker horns 43*a*, 43*b*, 43*c* has a first outer side wall 45, a second outer side wall 46, a first inner side wall 49, and a second inner side wall 50. As used herein, the proximal end 51 of each loudspeaker horn 43*a*, 43*b*, 43*c* refers to the end of the loudspeaker horn attached to the acoustic source 40**.

The first outer side wall 45 extends in a straight line from the distal end 44 of the respective loudspeaker horn **43*a*, 43*b*, 43*c* to a respective first transition point 47. Similarly, the second outer side wall 46 extends in a straight line from the distal end 44 of the respective loudspeaker horn 43*a*, 43*b*, 43*c* to a respective second transition point 48. In the embodiment shown in FIGS. 4 and 5, the angle between the first and second outer side walls 45, 46** of each loudspeaker is approximately 60 degrees.

A first projected extension 52 of the respective first outer side wall 45 intersects a second projected extension 53 of the respective second outer side wall 46 at the point of apparent acoustic origin 54. Each of the loudspeaker horns **43*a*, 43*b*, 43*c* also has a first inner side wall 49 extending curvilinearly from the respective first transition point 47 to the proximal end 51 of the respective loudspeaker horn 43*a*, 43*b*, 43*c*, and a second inner side wall 50 extending curvilinearly from the respective second transition point 48 to the proximal end 51 of the respective loudspeaker horn 43*a*, 43*b*, 43*c*. Thus, the inner side walls 49, 50 couple the outer side walls 45, 46 to the acoustic source 40**.

Figure 6:
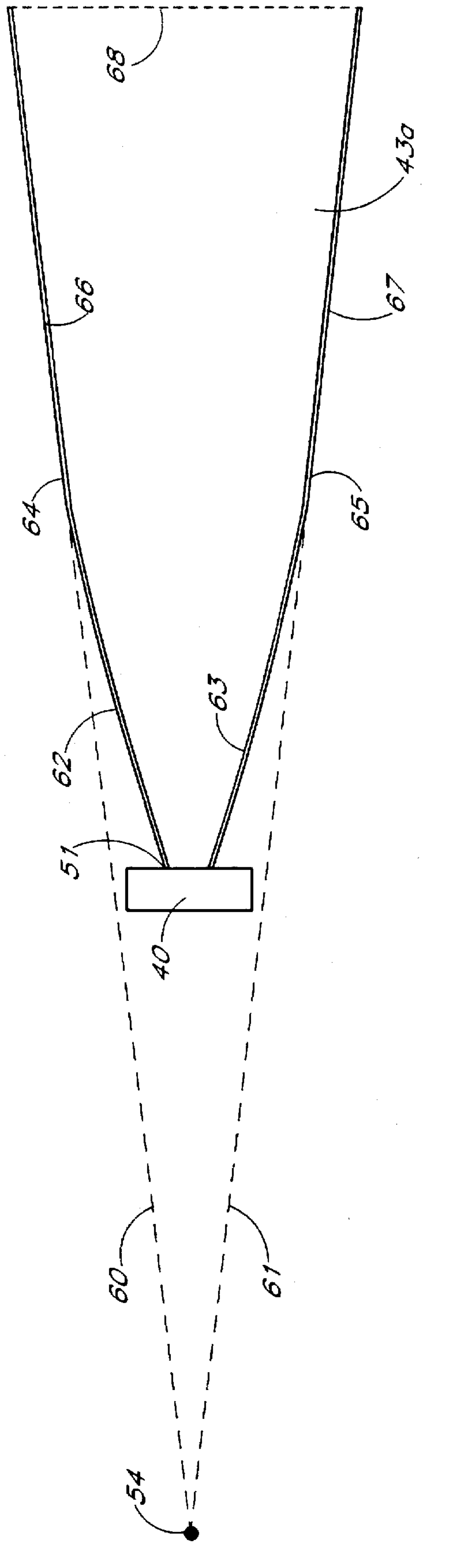
FIG. 6 shows a vertical cross-sectional view of a single loudspeaker shown in FIG. 4.

For purposes of simplicity, FIG. 6 shows the vertical cross section of the first loudspeaker horn **43*a*, which cross section is representative of the other loudspeaker horns in the loudspeaker array of the present invention. As shown in FIG. 6, the proximal end 51 of each loudspeaker horn 43*a* is attached to an acoustic source 40, and the loudspeaker horn 43*a* has an outer upper wall 66, an outer lower wall 67, an inner upper wall 62, and an inner lower wall 63. The outer upper wall 66 extends in a straight line from the distal end 44 of the loudspeaker horn 43*a* to the upper transition point 64**.

In a like manner, the outer lower wall 67 extends in a straight line from the distal end 44 of the loudspeaker horn **43*a* to the lower transition point 65. The upper projected extension 60 of the outer upper wall 66 intersects the lower projected extension 61 of the lower outer wall 67 at the point of apparent acoustic origin 54. Preferably, the angle between the outer upper wall 66 and the outer lower wall 67 is approximately 40 degrees. The inner upper wall 62 and the inner lower wall 63 extend curvilinearly from the transition points 64, 65 to the acoustic source 40 to couple the outer upper wall 66 and outer lower wall 67 to the acoustic source 40**.

Figure 7:
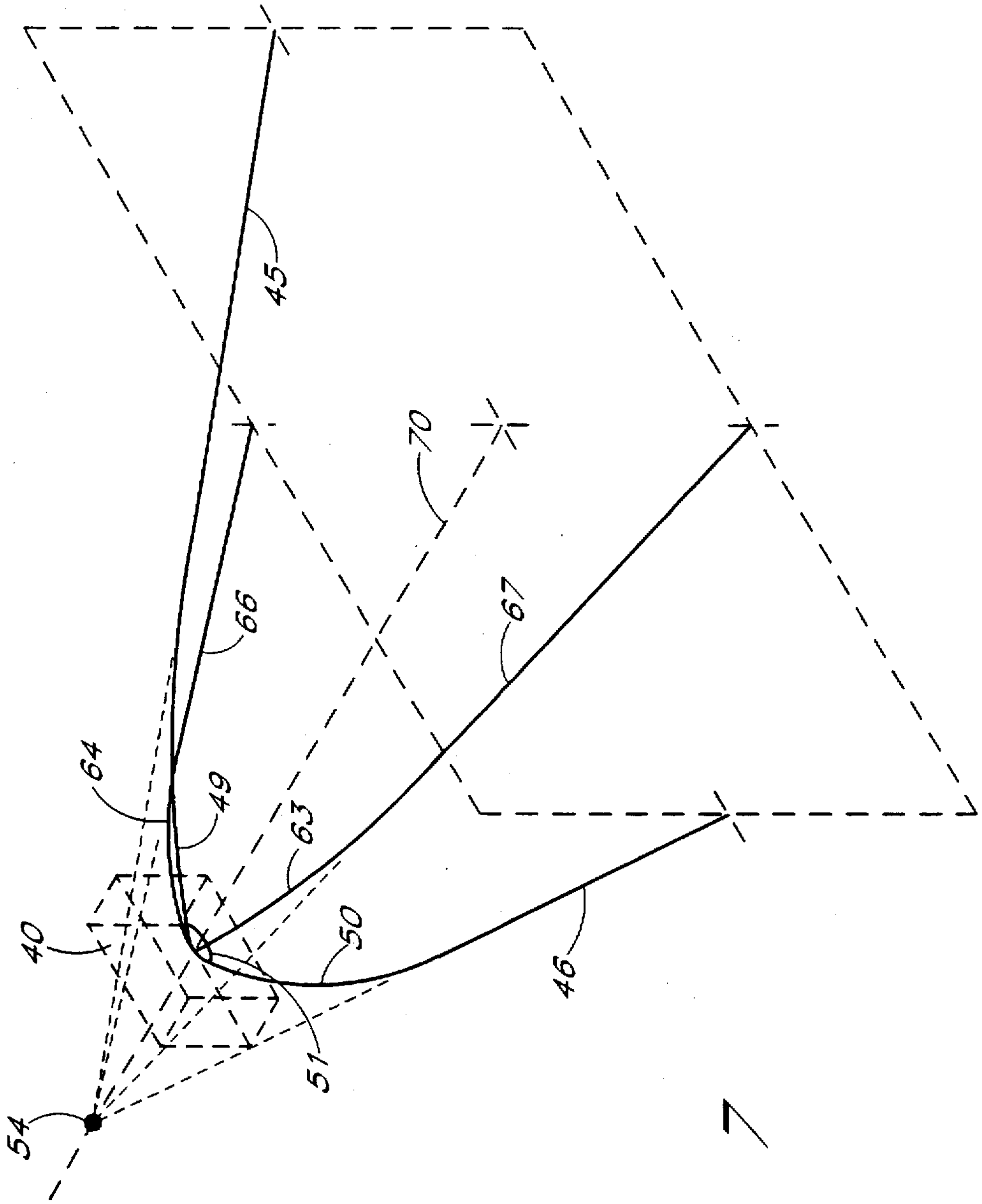
FIG. 7 shows a three-dimensional wire-frame view of a loudspeaker horn according to the present invention.

As seen in FIG. 7, the apparent acoustic origin 54 is the same point in the vertical and horizontal planes. Accordingly, the present invention eliminates the problems associated with astigmatism. In addition, as shown in FIG. 5, since the apparent acoustic origin 54 lies outside of the respective loudspeaker horns 43*a*, 43*b*, 43*c*, and behind the acoustic source 40, a plurality of loudspeaker horns 43*a*, 43*b*, 43*c* may be radially positioned in an array such that their apparent acoustic origins 54 (in both the horizontal and vertical planes) are substantially coincident. This apparent acoustic origin 54 lies along a centerline or axis 70 passing through the horn from its proximal to its distal end.

Figure 8:
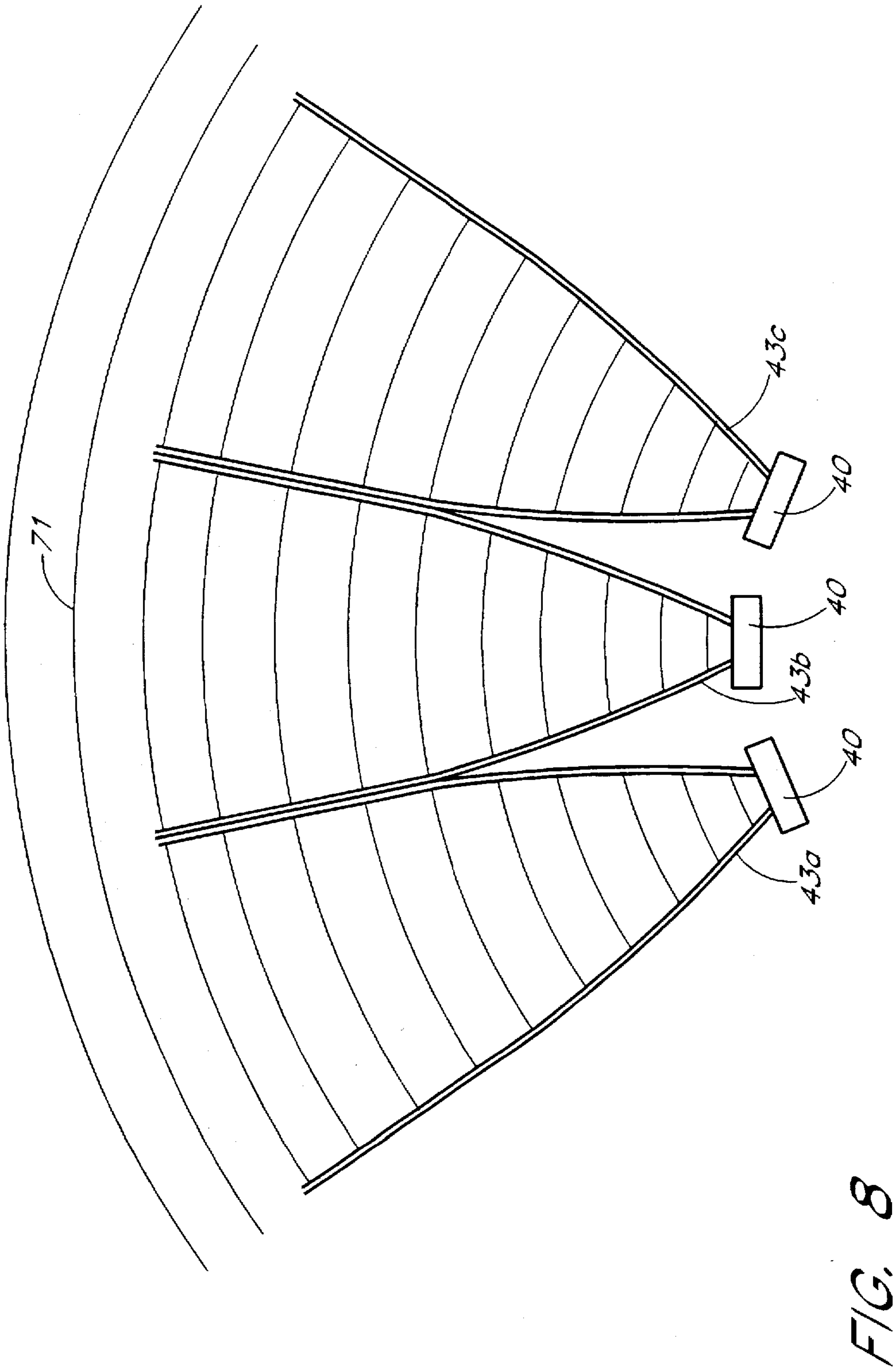
FIG. 8 shows a horizontal cross-sectional view of the coherent wave pattern of the loudspeaker array according to the present invention.

As illustrated in FIG. 8, the sound waves 71 emanating from adjacent loudspeaker horns 43*a*, 43*b*, 43*c* do not interfere with each other because they are perceived by the listener to be originating coherently from the same point.

Figure 9:
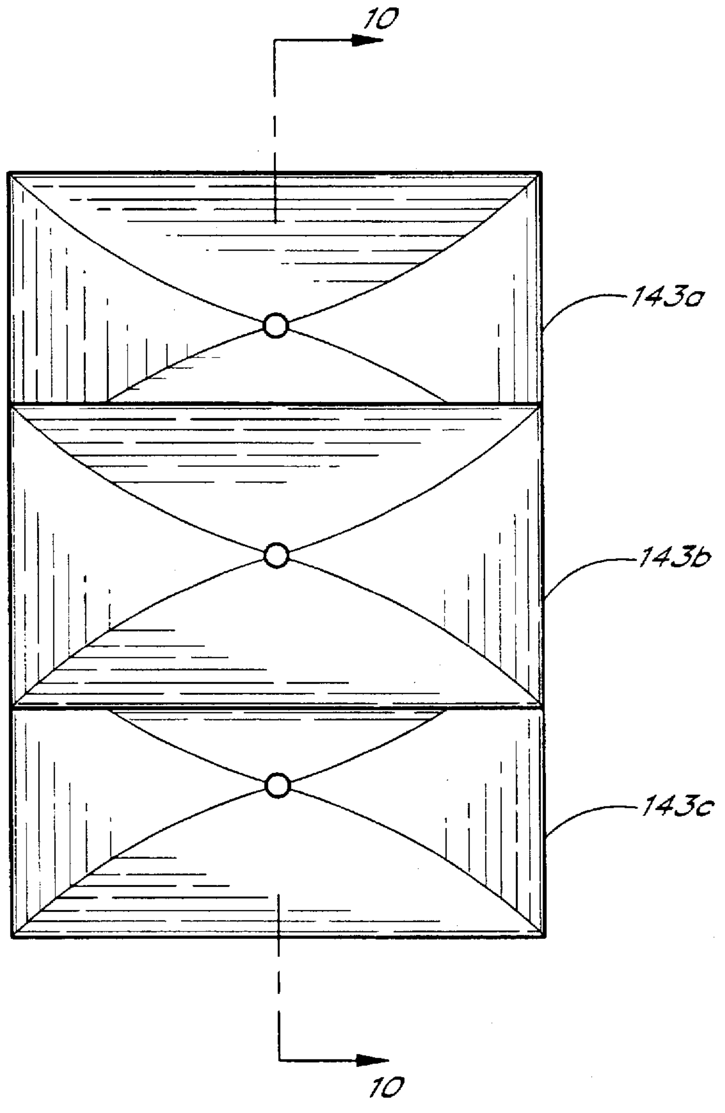
FIG. 9 shows a frontal view of a vertical loudspeaker array according to the present invention.
Figure 10:
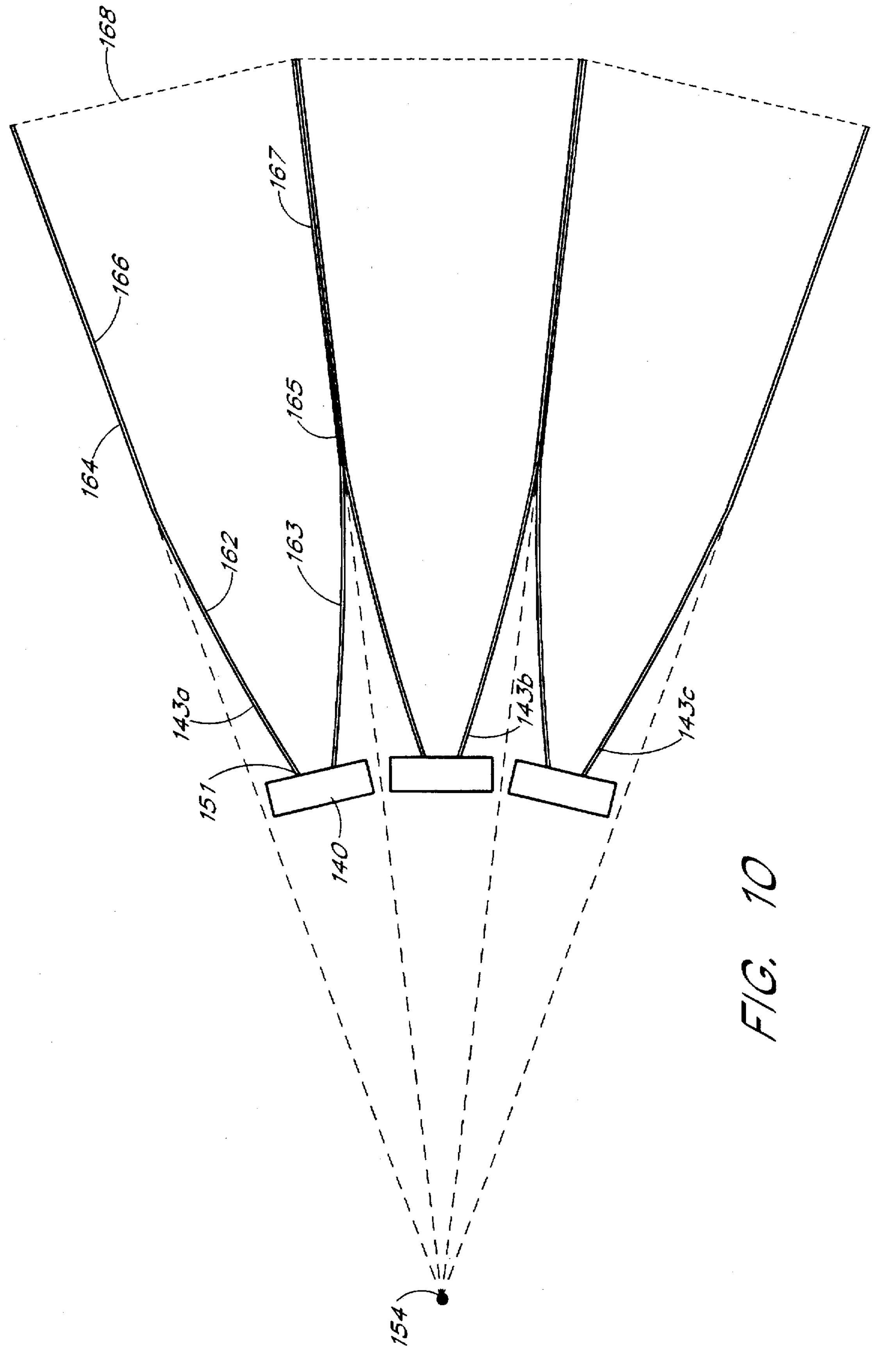
FIG. 10 shows a vertical cross-sectional view of the loudspeaker array shown in FIG. 9.

FIG. 9 illustrates a frontal view of three loudspeaker horns 143*a*, 143*b*, 143*c* arranged in a vertical array in accordance with the present invention. Each of these horns 143*a*, 143*b*, 143*c* is of the type and construction similar to that of horns 43*a*, 43*b*, 43*c* described above. As illustrated in FIG. 10, these horns 143*a*, 143*b*, 143*c* are arranged such that they have a common point of apparent acoustic origin 154. Each horn 143*a–c* is coupled to a respective acoustic source 140. Each horn 143*a–c* has a proximal end 151 and distal end 168. The horns 143*a–c* have upper and lower outer walls 166, 167 and upper and lower inner walls 162, 163. The outer upper wall 166 extends in a straight line from the distal end 168 to an upper transition point 164. Likewise, the outer lower wall 167 extends in a straight line from the distal end 168 to a lower transition point 165. The curvilinear upper and lower inner walls 162, 163 extend from the transition points 164, 165 to the acoustic source 140.

Figure 11:
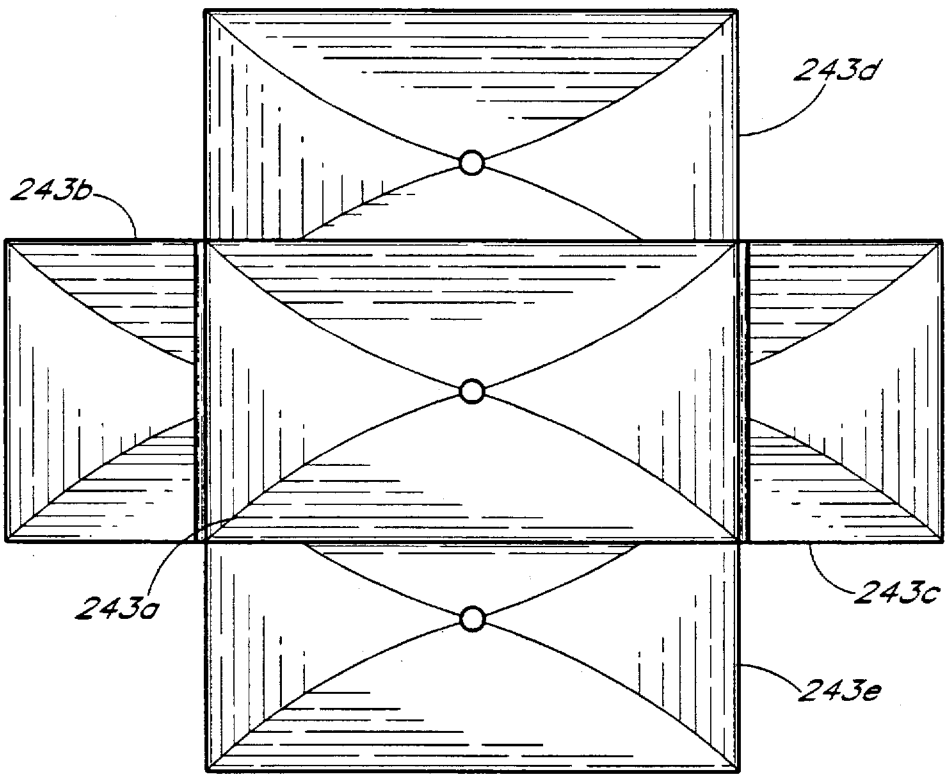
FIG. 11 shows a frontal view of a combined vertical and horizontal loudspeaker array according to the present invention.

FIG. 11 illustrates a combined vertical and horizontal array of horns in accordance with the present invention. As illustrated, there is a central horn 243*a*, with two adjacent horns 243*b*, 243*c* lying in a common horizontal plane. In addition, there are two adjacent horns 243*d*, 243*e* to the central horn 243*a* lying in a common vertical plane thereto. As with the arrays illustrated in FIGS. 4 and 9, all of the horns 243*a–e* of this combined array have a single point of apparent acoustic origin.

It should be understood that any number of horns in accordance with the present invention may be placed in a common array. FIGS. 4, 9, and 11 are merely illustrative of a specific number and orientation of these horns.

As described above, the first and second inner side walls 49, 50 of the horn 43 preferably extend curvilinearly from the transition point to the acoustic source. These walls are of a smooth curved shape. As one example, the walls 49, 50 may have a parabolic shape.

As also described above, the outer side walls 45, 46 and 66, 68 preferably extend in a straight-line. Preferably, these walls extend a sufficient distance from their respective transition points 47, 48 and 64, 65 to maintain sound directivity over a wide bandwidth.

The horn design of the present invention solves the problems associated with utilizing multiple prior art horns. First, horns in accordance with the present invention have an apparent acoustic source which is behind the true acoustic source. This permits alignment of the apparent horizontal and vertical acoustic sources for a single horn. This also permits alignment of the apparent horizontal and/or vertical acoustic sources of all horns in an array. Alignment of horizontal and vertical acoustic sources of multiple horns causes the horns of the array to produce coherent wave front.

As stated above, the prior art horns were designed to efficiently transmit all frequencies of sounds, including low frequency sounds. Use of multiple prior art horns resulted in coupling of the low frequency sounds because the low frequency sounds are not well-guided by the horns. The coupled low frequency sounds drown out the interfering higher frequency sounds transmitted from the multiple horns. The horn design of the present invention solves this problem. The shape of the present horn design transmits low frequency sounds less efficiently, thus reducing undesirable coupling of the low frequency sounds. The result is that the high and low frequency sounds produced by the array of horns are balanced.

It will be understood that the above described arrangements of apparatus and the method therefrom are merely illustrative of applications of the principles of this invention and many other embodiments and modifications may be made without departing from the spirit and scope of the invention as defined in the claims.

What is claimed is:

1. A loudspeaker for uniformly transmitting sound waves over a wide area in both the vertical and horizontal directions, comprising:

an acoustic source; and a loudspeaker horn having a proximal portion and a distal portion, the proximal portion defining a proximal end connected to the acoustic source, the proximal portion comprising opposing first and second proximal walls, and opposing third and forth proximal walls, the proximal walls extending curvilinearly from the proximal end of the loudspeaker horn to said distal portion, the distal portion defining a distal end of the horn and comprising opposing first and second distal walls, and opposing third and forth distal walls, the distal walls extending along substantially straight lines from the corresponding first, second, third, and forth proximal walls, and an axis passing through said source and said horn, whereby sound waves emanate from the acoustic source into the proximal end of the loudspeaker horn and out the distal end of the loudspeaker horn, the sound waves having as their perceived source an apparent point of origin behind the acoustic source and lying along said axis.

2. The loudspeaker of claim 1, in which the angle between the opposing first and second distal walls of the loudspeaker horn is approximately 60 degrees, and the angle between the opposing third and forth distal walls of the loudspeaker horn is approximately 40 degrees.

3. The loudspeaker of claim 1, in which the opposing first and second proximal walls and the opposing third and forth proximal walls each follow a parabolic curve.

4. A loudspeaker for uniformly transmitting sound waves over a wide area in both the vertical and horizontal directions, comprising:

a single acoustic source; and a loudspeaker horn extending from the acoustic source, the horn having a curvilinear surface proximal to the acoustic source coupled to a distal surface shaped to direct sound waves produced by the acoustic source into respective horizontal and vertical acoustic coverage areas, the respective horizontal and vertical acoustic coverage areas having as their perceived source respective apparent horizontal and vertical acoustic origins, the apparent horizontal and vertical acoustic origins being substantially coincident at a point opposite said acoustic source from said loudspeaker horn.

5. A method for uniformly transmitting sound waves over a wide area in both the vertical and horizontal directions, comprising:

providing a plurality or acoustic sources each acoustic source coupled to a separate loudspeaker horn;

emitting sound waves from each of said plurality of acoustic sources through each respective loudspeaker horn into respective horizontal and vertical acoustic coverage areas in the listening audience, the respective horizontal and vertical acoustic coverage areas having as their perceived source respective apparent horizontal and vertical acoustic origins, the apparent horizontal and vertical acoustic origins being substantially coincident at a point positioned behind the acoustic source; and radially positioning the plurality of acoustic sources with respect to each other such that the respective apparent horizontal and vertical acoustic origins of all loudspeaker horns are substantially coincident.

6. A loudspeaker system for uniformly transmitting sound waves over a wide area in both the vertical and horizontal directions, comprising:

a plurality of loudspeaker horns radially positioned with respect to each other, each of the plurality of loudspeaker horns being connected to a respective acoustic source, and each of the plurality of loudspeaker horns having a curvilinear surface proximal to the acoustic source coupled to a distal surface shaped to produce respective horizontal and vertical acoustic coverage areas in the listening audience the horizontal and vertical acoustic coverage areas having respective apparent horizontal and vertical acoustic origins from which a listener in the audience perceives the sound to originate, the apparent horizontal and vertical acoustic origins of all of the horns being substantially coincident at a point positioned behind the acoustic source.

* * * * *